United States Patent [19]

Chida et al.

[11] Patent Number: 5,607,868
[45] Date of Patent: Mar. 4, 1997

[54] METHOD OF FABRICATING SEMICONDUCTOR DEVICE WITH CHANNEL ION IMPLANTATION THROUGH A CONDUCTIVE LAYER

[75] Inventors: Nobuyoshi Chida, Kitakami; Masayuki Yoshida, Kawasaki, both of Japan

[73] Assignee: Kabushiki Kaisha Toshiba, Kawasaki, Japan

[21] Appl. No.: 487,248

[22] Filed: Jun. 13, 1995

[30] Foreign Application Priority Data

Jun. 15, 1994 [JP] Japan .................... 6-156586

[51] Int. Cl.⁶ .................... H01L 21/8238; H01L 21/8247
[52] U.S. Cl. .................... 437/34; 437/43; 437/45; 437/52; 437/56
[58] Field of Search .................... 437/29, 34, 41 CS, 437/43, 45, 46, 52, 56–59; 148/DIG. 82

[56] References Cited

U.S. PATENT DOCUMENTS

| | | | |
|---|---|---|---|
| 4,651,406 | 3/1987 | Shimizu et al. | 437/45 |
| 4,737,471 | 4/1988 | Shirato et al. | 437/45 |
| 4,845,047 | 7/1989 | Holloway et al. | 437/45 |
| 5,028,552 | 7/1991 | Ushiku | 437/45 |
| 5,248,627 | 9/1993 | Williams | 437/45 |
| 5,407,839 | 4/1995 | Maruo | 437/29 |

FOREIGN PATENT DOCUMENTS

| | | |
|---|---|---|
| 61-204972 | 9/1986 | Japan . |
| 61-204973 | 9/1986 | Japan . |
| 62-35574 | 2/1987 | Japan . |
| 63-160276 | 7/1988 | Japan . |
| 1-184956 | 7/1989 | Japan . |
| 2-111032 | 4/1990 | Japan . |
| 3-145160 | 6/1991 | Japan ................... 437/45 |
| 6-21094 | 1/1994 | Japan . |

*Primary Examiner*—Charles L. Bowers, Jr.
*Assistant Examiner*—Leon Radomsky
*Attorney, Agent, or Firm*—Finnegan, Henderson, Farabow, Garrett & Dunner, L.L.P.

[57] ABSTRACT

In a method of fabricating a semiconductor device in which at least one of a first conductive layer (polysilicon film) and a second conductive layer (polysilicon film) on a semiconductor substrate is used as a gate electrode of a MOS transistor to be formed on the semiconductor substrate, channel ion implantation for controlling the threshold voltages of the MOS transistors is performed by using the first conductive layer (polysilicon film) as a buffer film. Since the first conductive layer used as the gate electrode is also used as the buffer film, a dummy gate oxide film need not be provided, which is used as a buffer film for the channel ion implantation. Removal of the dummy gate oxide film is also unnecessary. Thus, it is possible to reduce the number of times of a dilute HF treatment which is performed to remove a dummy gate oxide film. The result is that a decrease in thickness of the field oxide film is reduced.

13 Claims, 9 Drawing Sheets

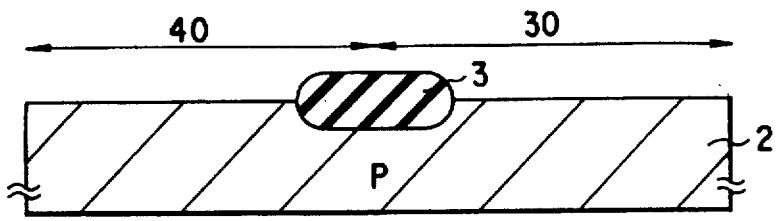
F I G. 1
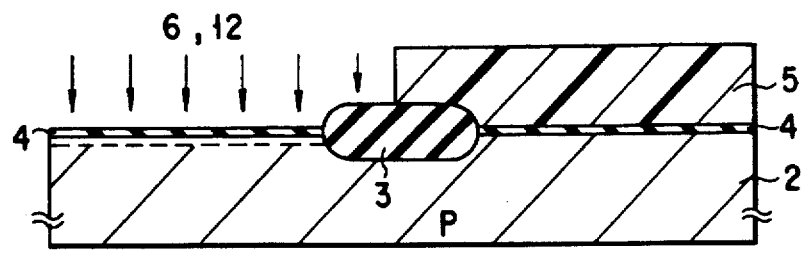
F I G. 2
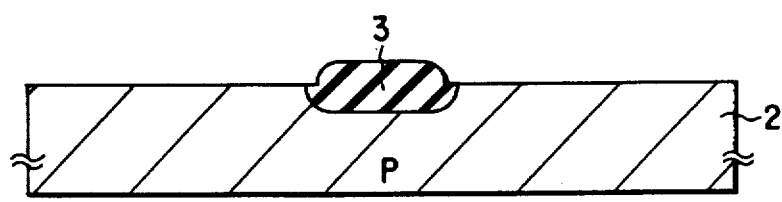
F I G. 3
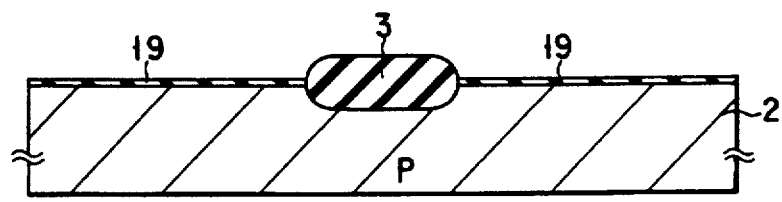
F I G. 4
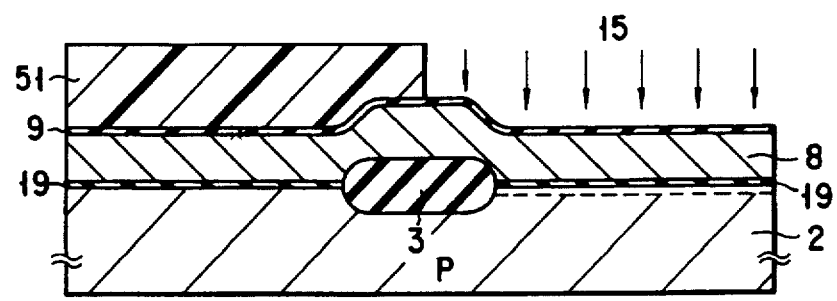
F I G. 5

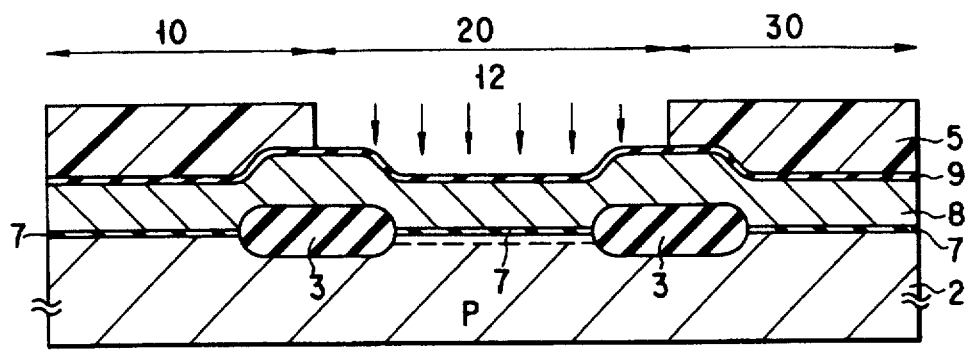
F I G. 10
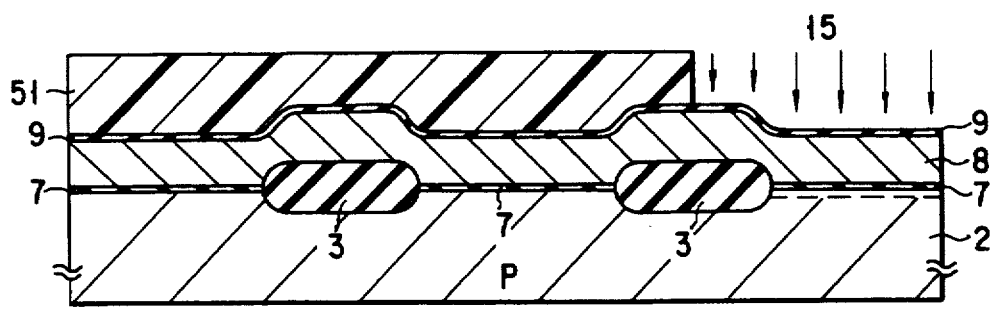
F I G. 11
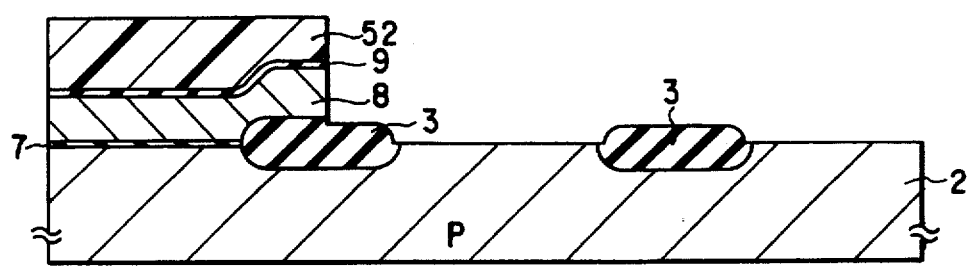
F I G. 12
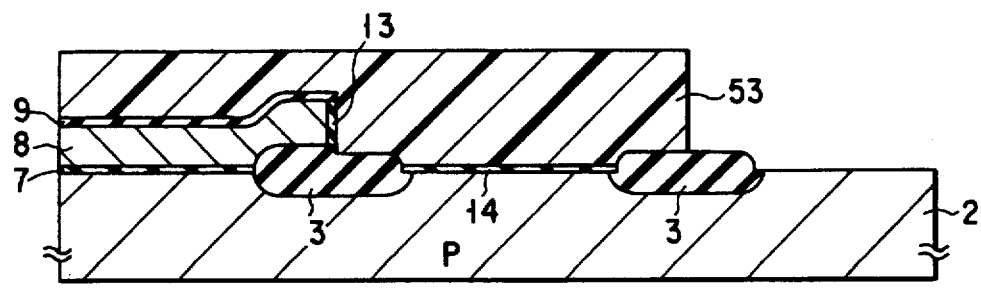
F I G. 13

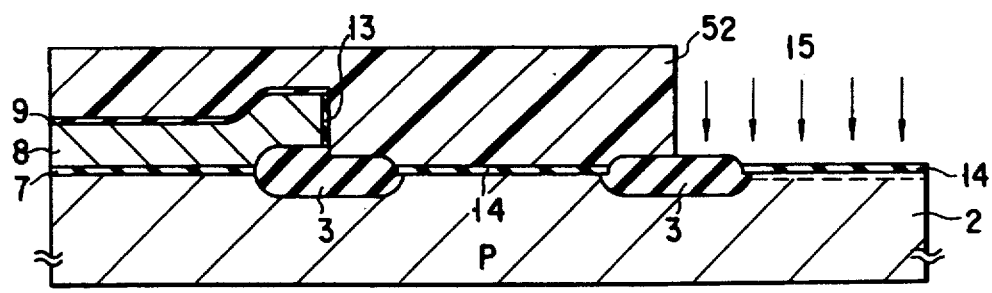
F I G. 20
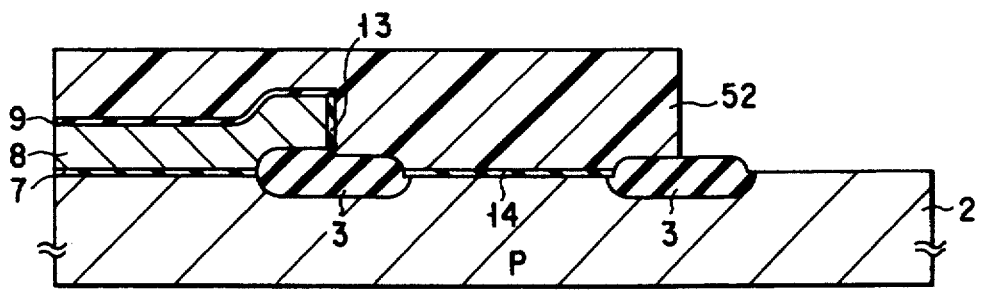
F I G. 21
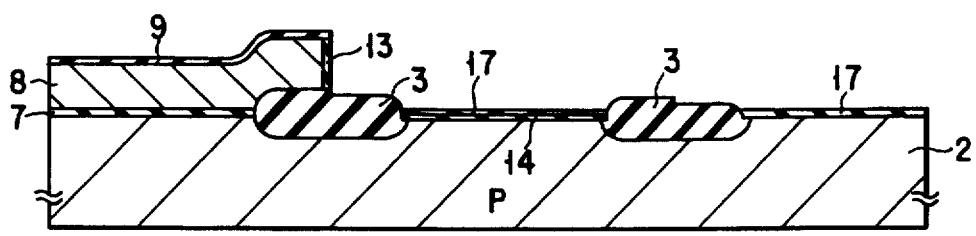
F I G. 22
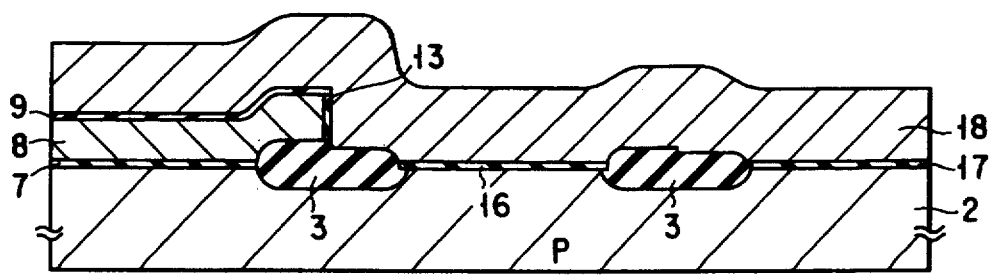
F I G. 23

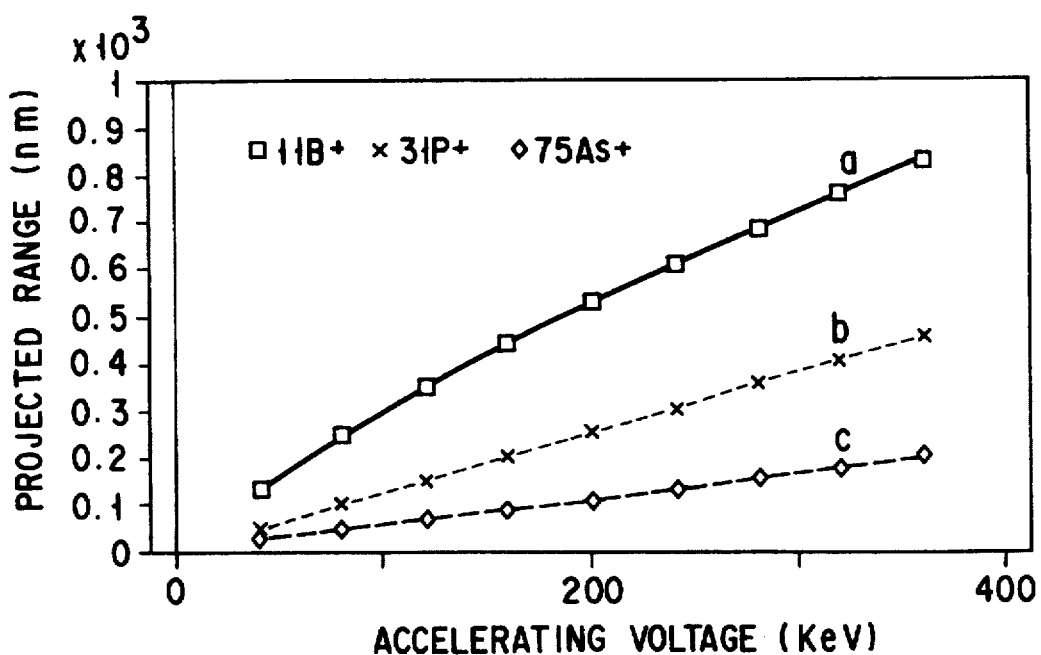
F I G. 24
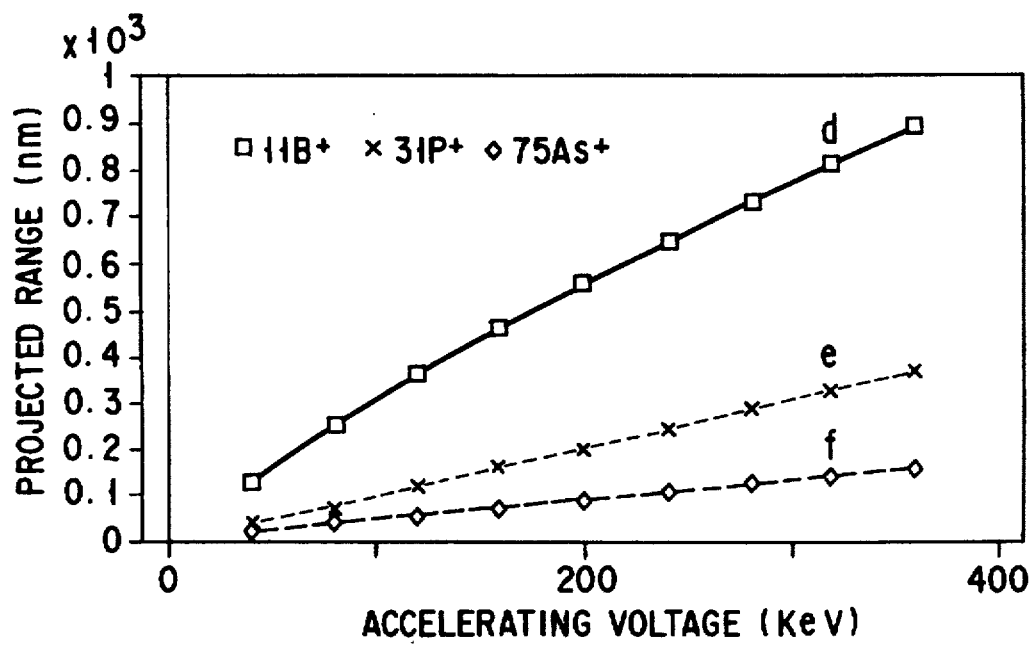
F I G. 25

5,607,868

1

METHOD OF FABRICATING SEMICONDUCTOR DEVICE WITH CHANNEL ION IMPLANTATION THROUGH A CONDUCTIVE LAYER

BACKGROUND OF THE INVENTION

1. Field of the Invention

The present invention relates to a semiconductor device having a nonvolatile memory or a multiple power supply and, more particularly, to a method of fabricating a semiconductor device in which the thicknesses of gate oxide films below gate electrodes formed in a plurality of regions are different.

2. Description of the Related Art

FIG. 9 is a plan view showing a conventional semiconductor device having both an EPROM and a logic. As in FIG. 9, a semiconductor substrate of this semiconductor device 1 includes a first region constituting a cell region 10, a second region constituting a high-voltage power supply (HV) region 20 which supplies a high voltage of, e.g., 12.5 V, and a third region constituting a logic region 30 which operates at a power supply voltage of, e.g., 5 V.

The fabrication steps of this semiconductor device will be described below with reference to the sectional views of a semiconductor structure in the fabrication steps illustrated in FIGS. 26 to 35. First, a 550-nm thick field oxide film 3 for isolating element formation regions from each other is formed on the surface of a semiconductor substrate 2 made from, e.g., a silicon semiconductor, by using a LOCOS process. For this purpose, a mask is formed on the element formation regions on the semiconductor substrate 2, and heating is performed. As a result, the field oxide film 3 as an element isolation region is formed. The formation of the field oxide film 3 separates the semiconductor substrate 2 into the cell region 10, the HV region 20, and the logic region 30 (FIG. 26). Subsequently, a dummy oxide film 4 about 15 nm thick is formed on these element formation regions 10, 20, and 30 on the surface of the semiconductor substrate 2. Additionally, a photoresist 5 for covering the HV region 20 and the logic region 30 is formed on these regions 20 and 30.

By using this photoresist 5 as a mask, boron ions (11B$^+$) 6 are implanted into the cell region 10 under the conditions of 60 keV and $3 \times 10^{12}$ atoms/cm$^2$ (FIG. 27). That is, ion implantation 6 into the channel region is done. Subsequently, the photoresist 5 is removed by an acid treatment in order to form a gate oxide film on the cell region 10. Thereafter, the dummy oxide film 4 on the element formation regions 10, 20, and 30 is etched away by a dilute HF treatment. This dilute HF treatment is accomplished by using a dilute HF solution containing NH$_4$, HF, and H$_2$O. Consequently, the field oxide film 3 is also etched and as a result the thickness of the film 3 is decreased (FIG. 28). A gate oxide film 7 about 25 nm thick is then formed on the element formation regions 10, 20, and 30 on the semiconductor substrate 2 by thermal oxidation (FIG. 29). After the formation of the gate oxide film 7, a polysilicon layer 8 (to be referred to as a first polysilicon layer hereinafter) as a first layer is formed on the element formation regions and on the field oxide film by CVD (Chemical Vapor Deposition). In this first polysilicon film 8, an impurity such as phosphorus is thermally diffused. An insulating film 9 is formed on the first polysilicon film 8. This insulating film 9 is constituted

2 by a three-layered film, i.e., an SiO$_2$/Si$_3$N$_4$/SiO$_2$ film (ONO film) (FIG. 30).

Subsequently, the HV region 20 and the logic region 30 are exposed to the surface of the insulating film 9, and a photoresist 51 having a pattern which covers the cell region 10 is formed. The insulating film 9 is selectively etched away by using the photoresist 51 as a mask, and the HV region 20 and the logic region 30 of the first polysilicon film 8 are removed by using anisotropic etching such as RIE (Reactive Ion Etching). Thereafter, the exposed gate oxide film 7, i.e., portions of the gate oxide film 7 on the HV region 20 and the logic region 30 are etched away by the dilute HF treatment (FIG. 31). After the photoresist 51 is removed by the acid treatment, a dummy gate oxide film 11 about 15 nm thick is formed on the HV region 20 and the logic region 30 by thermal oxidation. Consequently, an oxide film 13 is also formed by the thermal oxidation on the side wall of the first polysilicon film 8 on the cell region 10. Thereafter, a photoresist 52 having a pattern which covers the cell region 10 and the logic region 30 and exposes the HV region 20 is formed on the semiconductor substrate 2. By using this photoresist 52 as a mask, boron ions (11B$^+$) are implanted into a portion (the n-channel of HV) of the semiconductor substrate 2 below the dummy gate oxide film 11 in the HV region 20 under the conditions of 60 keV and $6 \times 10^{12}$ atoms/cm$^2$. That is, ion implantation 12 into the channel region is performed (FIG. 32).

Subsequently, the photoresist 52 is removed from the semiconductor substrate 2 by the acid treatment, and a photoresist 53 having a pattern which covers the cell region 10 and the HV region 20 and exposes the logic region 30 is formed on the semiconductor substrate 2. By using this photoresist 53 as a mask, boron ions (11B$^+$) are first deeply implanted into a portion (the n-channel of 5 V) of the semiconductor substrate 2 below the dummy gate oxide film 11 in the logic region 30 under the conditions of 80 keV and $1.5 \times 10^{12}$ atoms/cm$^2$. Boron ions (11B$^+$) are then shallowly implanted into the same portion under the conditions of 40 keV and $2.5 \times 10^{12}$ atoms/cm$^2$. That is, ion implantation 15 into the channel region is done (FIG. 33). After the photoresist 53 is removed by the acid treatment, a photoresist (not shown) which covers only the cell region 10 is formed. By using this photoresist as a mask, the dummy gate oxide film 11 is removed from the regions 20 and 30 by the dilute HF treatment. After the photoresist is removed by the acid treatment, a gate oxide film 14 about 18 nm thick is formed on the HV region 20 and the logic region 30. Note that the gate oxide film on the logic region 30 is not illustrated. A photoresist 54 which covers the cell region 10 and the HV region 20 is formed on the semiconductor substrate 2. By using this photoresist 54 as a mask, the gate oxide film 14 on the logic region 30 is removed by the dilute HF treatment (FIG. 34).

Finally, the photoresist 54 is removed by the acid treatment and the semiconductor substrate 2 is heated, forming a gate oxide film about 15 nm thick on the surfaces of the HV region 20 and the logic region 30. That is, in the HV region, a gate oxide film 16 about 25 nm thick is formed by stacking the oxide film on the gate oxide film 14. In the logic region 30, a gate oxide film 17 about 15 nm thick is formed by thermally oxidizing the surface of the semiconductor substrate. By this method, gate oxide films different in thickness are formed on the HV region 20 and the logic region 30. Thereafter, a polysilicon film (second polysilicon film) 18 as a second layer which serves as a gate electrode material is deposited on the entire surface of the semiconductor substrate 2 by the CVD process. As in the case of the first polysilicon film, an impurity such as phosphorus is diffused into this polysilicon film 18 (FIG. 35).

In such a conventional semiconductor device, for example, in a semiconductor device having both an EPROM and a logic, however, the gate electrodes in both the HV region and the logic region are made of the second polysilicon film. In addition, the gate oxide film thickness in the HV region is different from that in the logic region. Therefore, in the conventional fabrication method, a total of three oxide film removing steps using the dilute HF treatment are performed for the dummy gate oxide film in the cell, the gate oxide film in the cell, and the dummy oxide film in the HV region, before the gate oxide film in the HV region is formed. Furthermore, before the gate oxide film is formed in the logic region, removing of the gate oxide film in the HV region is performed in addition to the three-time dilute HF treatment; that is, the dilute HF treatment is performed a total of four times.

In the method of fabricating the conventional semiconductor device having both a memory and a logic as described above, the thickness of the field oxide film formed on the element isolation region is unavoidably decreased due to the dilute HF treatment performed a number of times in the oxide film removing steps. This decrease in the film thickness leads to a lowering or a variation in the field inverting voltage, causing leakage between the fields. In addition, a decrease in the field oxide film which is due to the film thickness decrease brings about a variation in the driving force of a transistor or leakage of the transistor. This causes a reduction in the yield of the products. In the prior art described above, it is desirable that the thickness of the field oxide film be 550 nm. However, the thickness is decreased to about 300 to 400 nm by the film thickness decrease caused by the dilute HF treatment performed a number of times.

SUMMARY OF THE INVENTION

The present invention has been made in consideration of the above conventional situation and has its object to provide a method of fabricating a semiconductor device, which can prevent a decrease or variation in field inverting voltage by preventing a decrease in film thickness of a field oxide film even if an acid treatment such as a dilute HF treatment is performed, and which can also maintain the high reliability accordingly while preventing a reduction in yield.

The characteristic feature of the present invention is that, in a method of fabricating a semiconductor device in which at least one of a first conductive layer and a second conductive layer on a semiconductor substrate is used as a gate electrode of a MOS transistor to be formed on the semiconductor substrate, ion implantation into a channel region to perform threshold voltage control of the MOS transistors is done by using the first conductive layer as a buffer film. That is, according to the first aspect of the present invention, there is provided a method of fabricating a semiconductor device, comprising the steps of: forming a field oxide film on a semiconductor substrate and providing element formation regions and an element isolation region on a major surface of the semiconductor substrate; forming a first gate oxide film on an entire surface of the element formation regions on the major surface of the semiconductor substrate; forming a first conductive layer on the entire major surface of the semiconductor substrate so as to cover the first gate oxide film; performing, in a second region of the element formation regions on the major surface of the semiconductor substrate, channel ion implantation for controlling a threshold voltage of a MOS transistor to be formed in the second region, by using the first conductive layer as a buffer film; removing the first conductive layer and the first gate oxide film from the element formation regions, excluding a first region and including the second region, on the major surface of the semiconductor substrate, thereby using the first conductive layer in the first region as a first gate electrode of a MOS transistor to be formed in the first region; forming a second gate oxide film in the second region; forming a second conductive layer on the entire major surface of the semiconductor substrate so as to cover the second gate oxide film; and using the second conductive layer in the second region as a second gate electrode of the MOS transistor to be formed in the second region. The thickness of the first gate oxide film may differ from that of the second gate oxide film.

According to the second aspect of the present invention, there is provided a method of fabricating a semiconductor device, comprising the steps of: forming a field oxide film on a semiconductor substrate and providing element formation regions and an element isolation region on a major surface of the semiconductor substrate; forming a first gate oxide film on an entire surface of the element formation regions on the major surface of the semiconductor substrate; forming a first conductive layer on the entire major surface of the semiconductor substrate so as to cover the first gate oxide film; performing, in a second region of the element formation regions on the major surface of the semiconductor substrate, channel ion implantation for controlling a threshold voltage of a MOS transistor to be formed in the second region, by using the first conductive layer as a buffer film; performing, in a third region of the element formation regions on the major surface of the semiconductor substrate, channel ion implantation for controlling a threshold voltage of a MOS transistor to be formed in the third region, by using the first conductive layer as a buffer film; removing the first conductive layer and the first gate oxide film formed below the first conductive layer from the element formation regions, excluding a first region and including the second and third regions, on the major surface of the semiconductor substrate, thereby using the first conductive layer in the first region as a first gate electrode of a MOS transistor to be formed in the first region; forming a second gate oxide film in the second region; forming a third gate oxide film in the second and third regions such that the third gate oxide film overlaps the second gate oxide film in the second region; forming a second conductive layer on the entire major surface of the semiconductor substrate so as to cover the third gate oxide film; and using the second conductive layer in the second and third regions as a second gate electrode and a third gate electrode of the MOS transistors to be formed in the second and third regions.

According to the third aspect of the present invention, there is provided a method of fabricating a semiconductor device, comprising the steps of: forming a field oxide film on a semiconductor substrate and providing element formation regions and an element isolation region on a major surface of the semiconductor substrate; forming a first gate oxide film on an entire surface of the element formation regions on the major surface of the semiconductor substrate; forming a first conductive layer on the entire major surface of the semiconductor substrate so as to cover the first gate oxide film; performing, in a second region of the element formation regions on the major surface of the semiconductor substrate, channel ion implantation for controlling a threshold voltage of a MOS transistor to be formed in the second region, by using the first conductive layer as a buffer film; removing the first conductive layer and the first gate oxide film formed below the first conductive layer from the element formation regions, excluding a first region and including the second region and a third region, on the major surface of the semiconductor substrate, thereby using the first conductive layer in the first region as a first gate electrode of a MOS transistor to be formed in the first region; forming a second gate oxide film in the second and third regions; performing, in the third region of the element formation regions on the major surface of the semiconductor substrate, channel ion implantation for controlling a threshold voltage of a MOS transistor to be formed in the third region, by using the second gate oxide film as a buffer film; removing the second gate oxide film from the third region; forming a third gate oxide film in the second and third regions such that the third gate oxide film overlaps the second gate oxide film in the second region; forming a second conductive layer on the entire major surface of the semiconductor substrate so as to cover the third gate oxide film; and using the second conductive layer in the second and third regions as a second gate electrode and a third gate electrode of the MOS transistors to be formed in the second and third regions.

Each of the above methods can further comprise the step of forming, in the first region, a memory cell with a layered gate structure which uses the first conductive layer as a floating gate and the second conductive layer, formed on the floating gate via an insulating interlayer, as a control gate. Also, the first conductive layer can be made of a polysilicon film with a film thickness of 100 nm or less.

Since the first conductive layer used as the gate electrode is also used as a buffer film, it is possible to reduce the number of times of a dilute HF treatment for removing a dummy gate oxide film. This reduces a decrease in thickness of the field oxide film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1 to 8 are sectional views of a semiconductor structure in the fabrication steps of a semiconductor device according to a first embodiment of the present invention;

FIGS. 10 to 16 are sectional views of a semiconductor structure in the fabrication steps of a semiconductor device according to a second embodiment of the present invention;

FIGS. 18 to 23 are sectional views of a semiconductor structure in the fabrication steps of a semiconductor device according to a third embodiment of the present invention;

FIG. 24 is a graph for explaining the accelerating voltage dependence of a projected range in channel implantation of the present invention;

FIG. 25 is a graph for explaining the accelerating voltage dependence of a projected range in channel implantation of the present invention.

DETAILED DESCRIPTION OF THE PREFERRED EMBODIMENTS

Preferred embodiments of the present invention will be described below with reference to the accompanying drawings.

Figure 6:
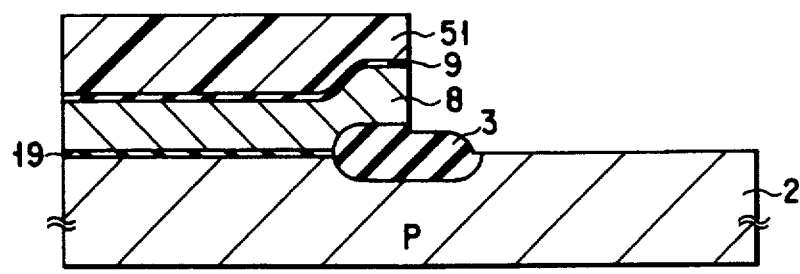
Figure 7:
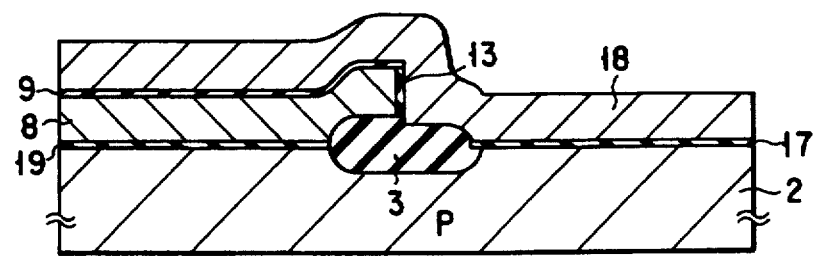
Figure 8:
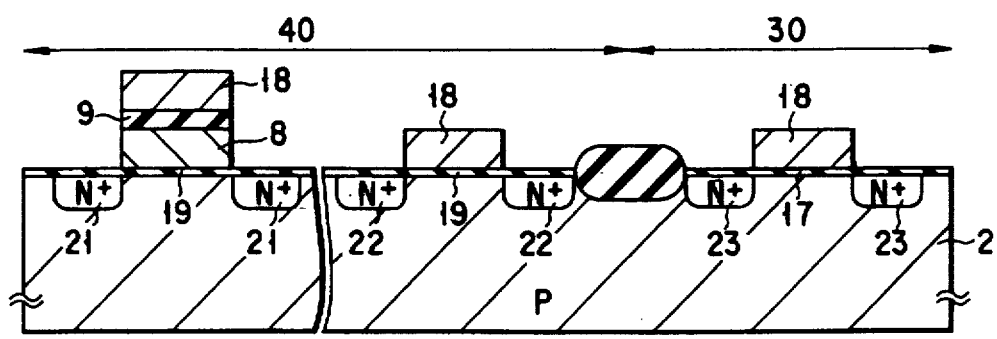

A first embodiment will be described below with reference to FIGS. 1 to 8. FIGS. 1 to 7 are sectional views of a semiconductor structure in the fabrication steps of a semiconductor device having a peripheral high-voltage (HV) portion which includes a cell region, such as an EPROM, and a logic portion. As illustrated in FIG. 8, a semiconductor substrate 2 of this semiconductor device includes a first region which constitutes an HV portion 40 having a high-voltage power supply of, e.g., 12.5 V, and a second region which constitutes a logic portion 30 operating at, e.g., 5 V. A field oxide film 3 about 550 nm thick which is an element isolation region for isolating the regions 30 and 40 is formed on the surface of the semiconductor substrate 2 made from, e.g., a p-type silicon semiconductor, by a LOCOS process. That is, a mask is formed on the element formation regions on the surface of the semiconductor substrate 2, and the element isolation region 3 is formed by annealing. The formation of the field oxide film 3 isolates the cell/HV region 40 and the logic region 30 on the semiconductor substrate 2 (FIG. 1). Subsequently, a dummy oxide film 4 about 15 nm thick is formed on the element formation regions on the surface of the semiconductor substrate 2 by an acid treatment using dry HCl.

A photoresist 5 having a pattern which opens a cell/HV region 40 and covers the logic region 30 is formed on the dummy oxide film 4. By using this photoresist 5 as a mask, boron ions (11$^+$) are implanted into the cell portion of the cell/HV region 40 under the conditions of 60 keV and 3×10$^{12}$ atoms/cm$^2$, thereby performing channel ion implantation 6 for controlling the threshold voltage of a MOS transistor. Thereafter, the photoresist 5 is removed and a new identical photoresist 5 is formed. The new photoresist is used as a mask to implant boron ions (11B$^+$) into the HV portion of the cell/HV region 40 under the conditions of 60 keV and 2.5×10$^{12}$ atoms/cm$^2$, performing another channel ion implantation (FIG. 2). The photoresist 5 is removed by the acid treatment in order to form a gate oxide film in the cell/HV region. The dummy oxide film 4 in the cell/HV region 40 and the logic region 30 is etched away by a dilute HF treatment. This dilute HF treatment is done by using a dilute HF solution containing NH$_4$F, HF, and H$_2$O. The field oxide film 3 reduces its thickness by this treatment (FIG. 3). Thereafter, a gate oxide film 19 about 25 nm thick is formed on the element formation regions on the semiconductor substrate 2 by oxidation using dry HCl (FIG. 4).

After the formation of the gate oxide film 19, a polysilicon film 8 (to be referred to as a first polysilicon film hereinafter) as a first conductive layer about 100 nm thick is deposited on the element formation regions and the field oxide film by a CVD process. An impurity such as phosphorus is thermally diffused into this first polysilicon film 8. An insulating film 9 is formed on the first polysilicon film 8. The insulating film 9 is constituted by a three-layered film, i.e., an $SiO_2/Si_3N_4/SiO_2$ film (ONO film) (FIG. 5). The thicknesses of the layers of this ONO film 9 are approximately 18 nm/15 nm/6 nm. Subsequently, a photoresist 51 is formed on the insulating film 9 and so patterned as to cover only the cell/HV region 40 and to be removed from the logic region 30. By using the photoresist 51 thus patterned as a mask and the first polysilicon film 8 as a buffer film, boron ions ($11B^+$) are first deeply implanted into the logic region 30 (the n-channel of 5 V) under the conditions of 120 keV and $1.5 \times 10^{12}$ atoms/$cm^2$. Boron ions ($11B^+$) are then shallowly implanted into the same region under the conditions of 80 keV and $2.5 \times 10^{12}$ atoms/$cm^2$. In this manner, channel ion implantation 15 is performed (FIG. 5). The channel ion implantation 15 is performed to control the threshold voltage of the MOS transistor.

The insulating film 9 is selectively etched away, and the first polysilicon film 8 in the logic region 30 is removed using anisotropic etching such as RIE (Reactive Ion Etching). Thereafter, the exposed gate oxide film 19 on the logic region 30 is removed by the dilute HF treatment (FIG. 6). After the photoresist 51 is removed by the acid treatment, a gate oxide film 17 about 15 nm thick is formed on the logic region 30 by dry HCl oxidation. Consequently, an oxide film 13 is also formed on the side wall of the first polysilicon film 8 in the cell/HV region 40 by the oxidation. Thereafter, a polysilicon film (second polysilicon film) 18 as a second layer which serves as a gate electrode material is deposited to have a thickness of approximately 400 nm on the entire surface of the semiconductor substrate 2 by the CVD. As in the case of the first polysilicon film, an impurity such as phosphorus is diffused into the second polysilicon film 18 (FIG. 7).

The first and second polysilicon films 8 and 18 formed on the semiconductor substrate 2 are appropriately patterned to form gate electrodes of MOS transistors in the individual regions. The subsequent fabrication steps are performed to form these MOS transistors (FIG. 8). In the cell/HV region 40 as the first region, an EPROM cell is formed in the cell portion, and a high-voltage MOS transistor is formed in the HV portion. In the logic region 30 as the second region, a transistor having a thin gate oxide film is formed. In the EPROM cell in the cell portion, $n^+$-type source/drain regions 21 are formed in the surface region of the semiconductor substrate 2. A floating gate 8 made of the first polysilicon film is formed on a portion sandwiched between the regions 21 via the gate oxide film 19 about 25 nm thick. On this floating gate 8, a control gate 18 made of the second polysilicon film is stacked via the ONO insulating film 9. This cell is covered and protected by an insulating film and a protective film (neither is shown).

In this first embodiment (FIGS. 1–8), the first polysilicon film is used as a buffer film, when performing the channel implantation for the logic region 30. Consequently, a corresponding dummy oxide film need not be formed, and this effectively reduces the characteristic change in the semiconductor device caused by the dilute HF treatment in comparison with that in the conventional semiconductor device described previously. Also, a decrease in thickness of the film oxide film is reduced. In addition, in this embodiment, the cell region and the HV region are formed in the single element formation region 40. That is, a plurality of regions different in function but having the same gate oxide film thickness can be formed in one element formation region. This increases the degree of integration of the semiconductor device.

As described above, in this embodiment, the gate oxide film thickness in the first region (cell/HV region) 40 of the semiconductor substrate 2 differs from that in the second region 30. In the present invention, however, the thicknesses of the gate oxide films can be made equal regardless of regions where these films are formed. As an example, in the present invention, both of a MOS transistor in a cell/HV region and a MOS transistor in a logic region can be set to have a gate film thickness of about 25 nm.

A second embodiment will be described below with reference to FIGS. 9 to 17, and FIGS. 26 to 30 relating to the prior art.

Figure 9:
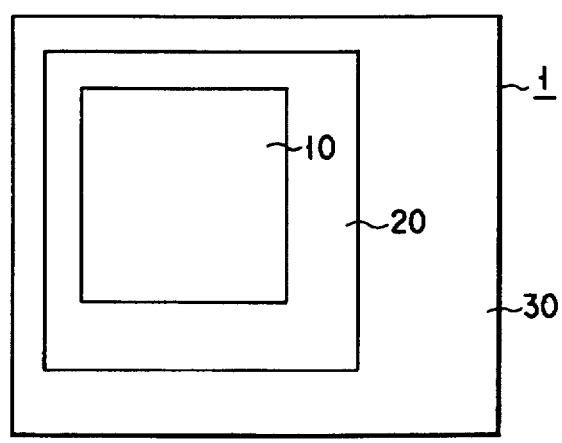
FIG. 9 is a schematic plan view of a semiconductor device of the present invention and a conventional semiconductor device.
Figure 14:
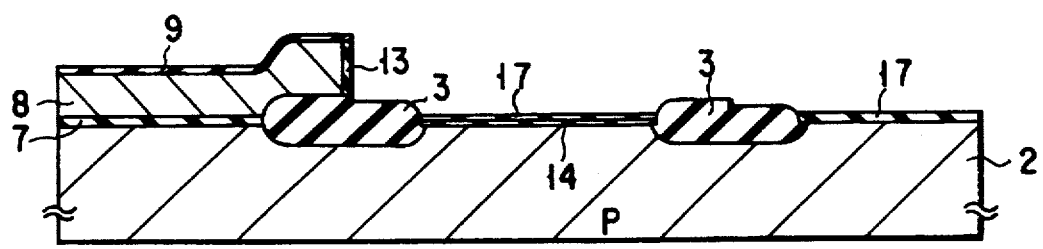
Figure 15:
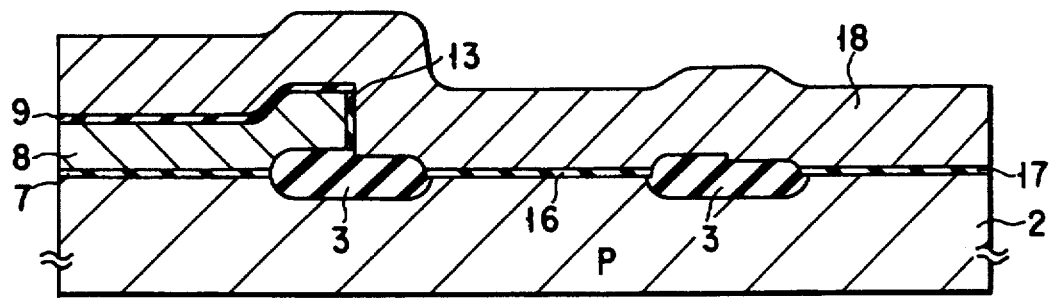
Figure 16:
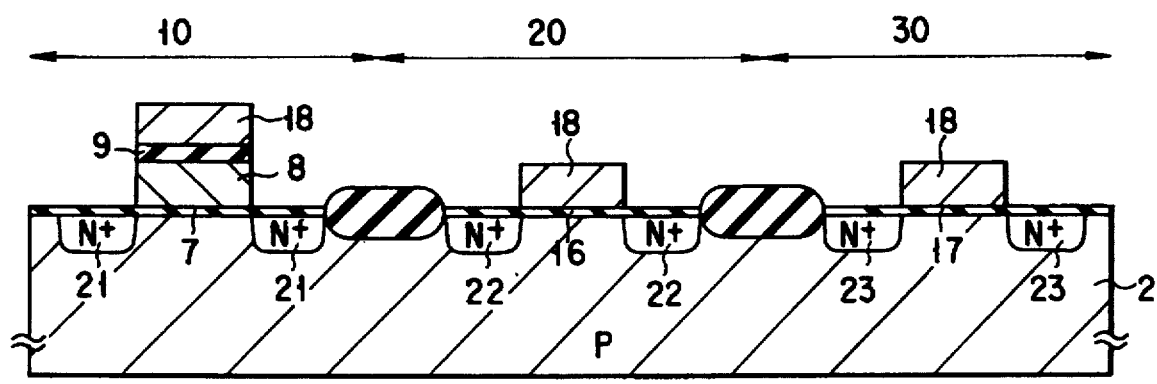
Figure 17:
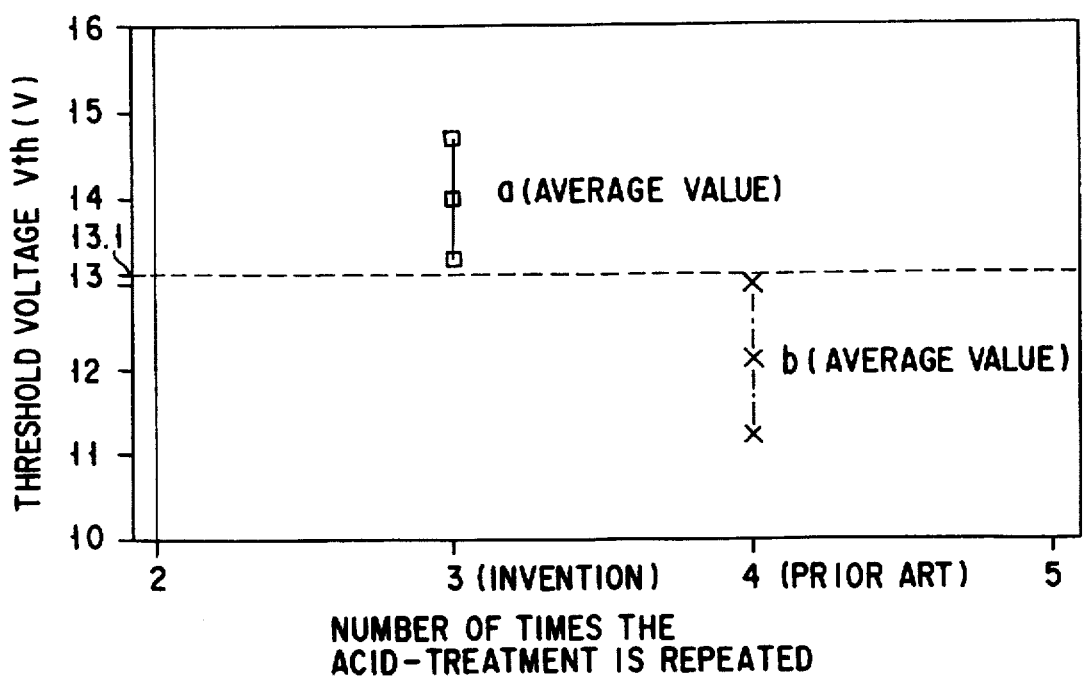
FIG. 17 is a graph for explaining the dependence of the threshold voltage of a field transistor of the present invention on the number of times an acid treatment is repeated.
Figure 26:
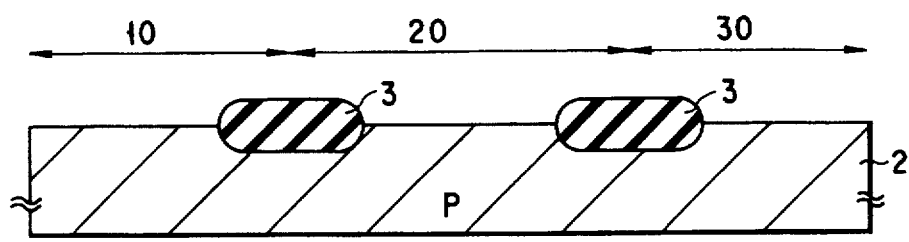
FIGS. 26 to 35 are sectional views of a semiconductor structure in conventional fabrication steps of a semiconductor device.

FIG. 9 is a plan view of a semiconductor device having both an EPROM and a logic. FIGS. 10 to 15 are sectional views showing semiconductor structures during the fabrication steps of a semiconductor device having an EPROM cell region as a first region, an HV region as a second region which includes a control circuit for the EPROM, and a logic region as a third region. FIG. 16 is a schematic sectional view of the semiconductor device. FIG. 17 is a graph showing the characteristics of the device. As in FIG. 9, a semiconductor device 1 is formed on a semiconductor substrate which includes a cell region 10 in which an EPROM cell is formed, an HV region 20 in which a high-voltage MOS transistor (Vpp=12.5 V) is formed, and a logic region 30. The former steps of the manufacturing method in this second embodiment are the same as those of the prior art manufacturing method and, thus will be described by referring to prior art FIGS. 26 to 30. A field oxide film 3 about 550 nm thick for isolating these element formation regions is formed on the surface of the semiconductor substrate, 2, which is made from, e.g., a p-type silicon semiconductor, by using a LOCOS process (FIG. 26). This field oxide film 3 decreases its thickness in the subsequent annealing and acid treatment. The field oxide film 3 is formed on an element isolation region by masking the surface of the semiconductor substrate 2 except for the element formation regions.

Figure 27:
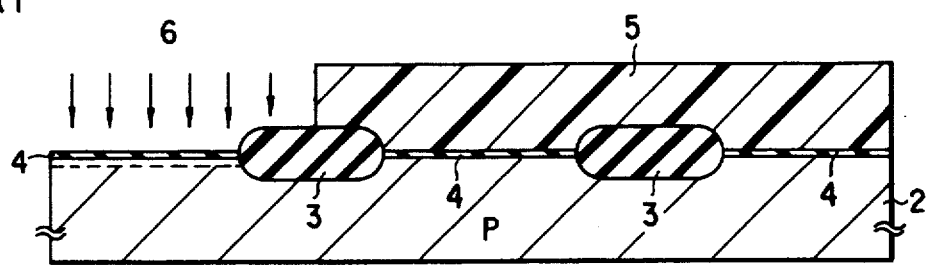
Figure 28:
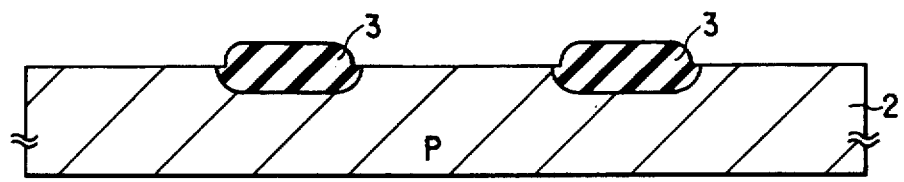
Figure 29:
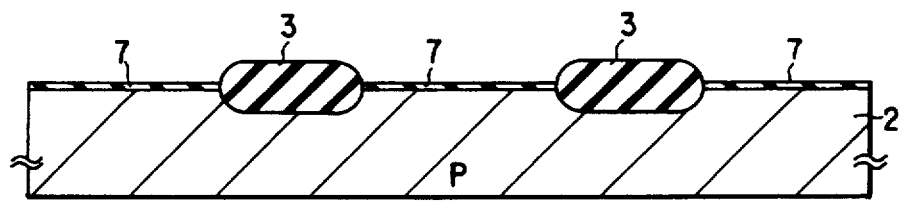

The formation of the field oxide film 3 separates the semiconductor substrate 2 into the cell region 10 in which the EPROM cell is formed, the HV region 20 in which the high-voltage MOS transistor (Vpp=12.5 V) is formed, and the logic region 30. A dummy oxide film 4 about 15 nm thick is then formed on the element formation regions on the surface of the semiconductor substrate 2 (FIG. 27). A photoresist 5 having a pattern which opens the cell region 10 and covers the HV region 20 and the logic region 30 is formed on the dummy oxide film. By using this photoresist as a mask, boron ions ($11B^+$) are implanted into the cell region 10 under the conditions of 60 keV and $3 \times 10^{12}$ atoms/$cm^2$, performing channel ion implantation (channel implantation). Subsequently, to form a gate oxide film on the cell region 10, the photoresist is peeled by etching. Thereafter, the dummy oxide film on the cell is etched away by a dilute HF treatment. This dilute HF treatment is done by using a dilute HF solution containing $NH_4F$, HF, and $H_2O$. This treatment is the first acid treatment. By this treatment, the thickness of the field oxide film 3 is decreased (FIG. 28). Thereafter, a gate oxide film 7 about 25 nm thick is formed on the element formation regions on the semiconductor substrate 2 by annealing as of dry HCl oxidation (FIG. 29).

Figure 30:
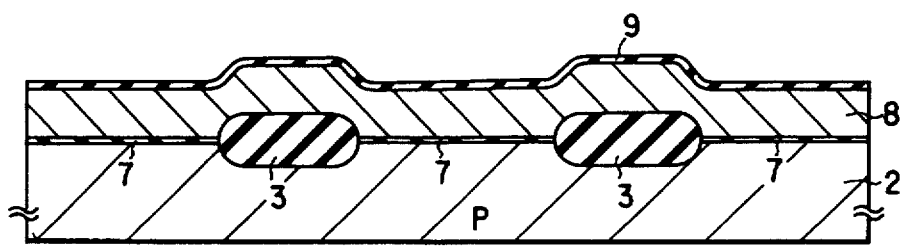
Figure 31:
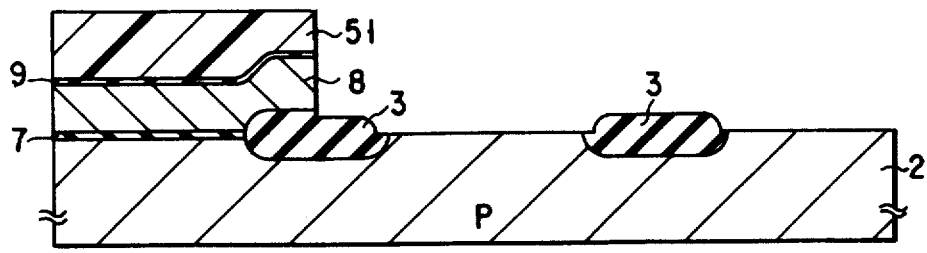
Figure 32:
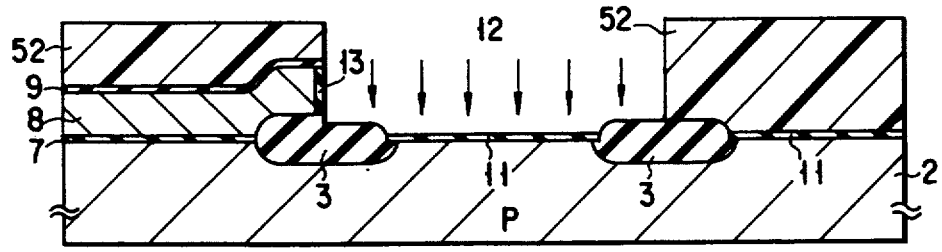
Figure 33:
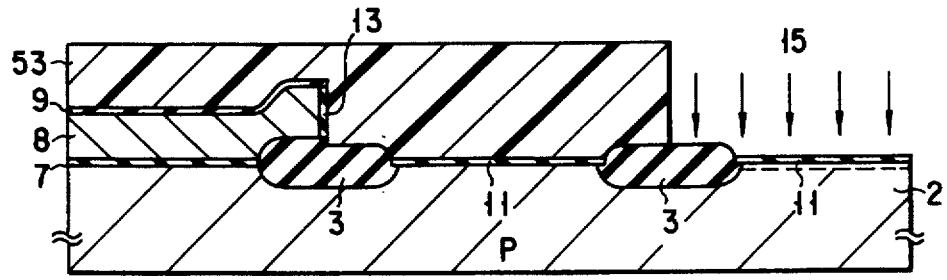
Figure 34:
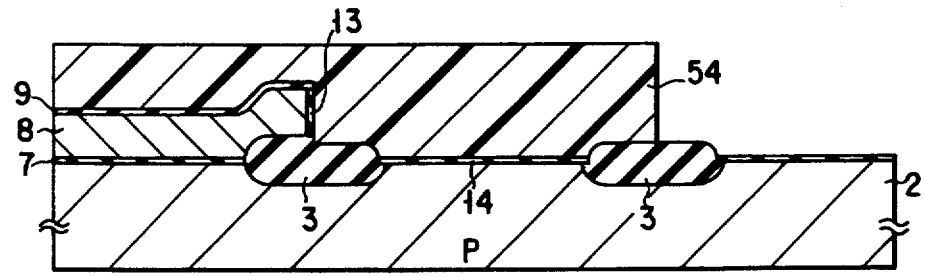
Figure 35:
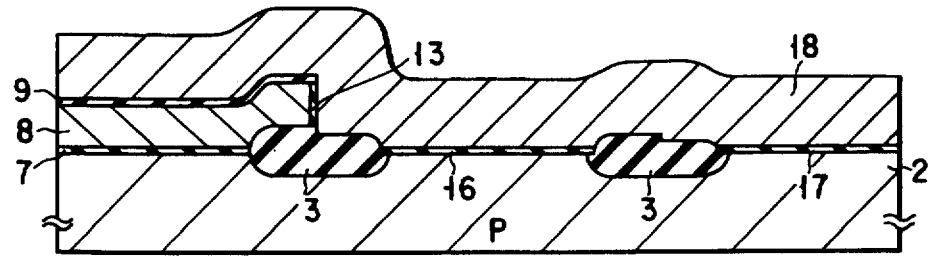

After the formation of the gate oxide film 7, a 100-nm thick polysilicon film 8 (first polysilicon film) as a first layer is deposited on the element formation regions and the field oxide film by CVD (Chemical Vapor Deposition) (FIG. 30). An impurity such as phosphorus is diffused into this first polysilicon film 8. An insulating film 9 is formed on the first polysilicon film 8. The insulating film 9 is constituted by a three-layered film, i.e., an $SiO_2/Si_3N_4/SiO_2$ film (ONO film). The fabrication steps described prior to this point are the same as the conventional fabrication steps (FIGS. 26 to 30).

Following steps differ from those of the prior art, and will be described with reference to FIGS. 9 to 16. A photoresist 5 is formed on the insulating film 9 and so patterned as to cover the cell region 10 (the first region) and the logic region 30 (the third region) and to be removed from the HV region 20. By using this photoresist 5 as a mask and the first polysilicon film 8 as a buffer film, boron ions ($11B^+$) are implanted into a portion (the n-channel of the HV region) below the gate oxide film 7 through the first polysilicon film 8 in the HV region and the insulating film 9 stacked on the film 8, under the conditions of 100 keV and $6 \times 10^{12}$ atoms/$cm^2$, thereby performing channel ion implantation 12 (FIG. 10).

After the photoresist 5 is etched away, a photoresist 51 is formed on the insulating film 9 and patterned to open the logic region 30 (the third region) alone. By using this photoresist 51 as a mask and the first polysilicon film 8 as a buffer film, boron ions ($11B^+$) are first deeply implanted into a portion (the n-channel of 5 V) below the gate oxide film 7 through the first polysilicon film 8 in the logic region 30 and the insulating film 9 stacked on the film 8, under the conditions of 120 keV and $1.5 \times 10^{12}$ atoms/$cm^2$. Boron ions ($11B^+$) are then shallowly implanted into the same portion under the conditions of 80 keV and $2.5 \times 10^{12}$ atoms/$cm^2$. In this way, channel ion implantation 15 is performed (FIG. 11). After the photoresist 51 is removed by etching, a photoresist 52 is formed on the insulating film 9 and patterned to cover only the cell region 10 (the first region). The insulating film 9 is selectively etched away by using the photoresist 52 thus patterned as a mask, and portions of the first polysilicon film 8 on the HV region 20 and the logic region 30 are removed by using anisotropic etching such as RIE.

Thereafter, the exposed gate oxide film 7 is removed by the dilute HF treatment (FIG. 12). This treatment is the second acid treatment. Subsequently, the photoresist 52 on the cell region is etched away, and a gate oxide film 14 about 18 nm thick is formed on the HV region 20 and the logic region 30 (the third region) by annealing as of dry HCl oxidation. Consequently, an oxide film 13 is also formed on the side wall of the first polysilicon film 8 in the cell region 10 by the thermal oxidation. Thereafter, a photoresist 53 having a pattern which exposes the logic region 30 (the third region) is formed on the semiconductor substrate 2. By using this photoresist 53 as a mask, the gate oxide film 14 in the logic region 30 is removed by the dilute HF treatment (FIG. 13). This treatment is the third acid treatment. The photoresist 53 is then etched away from the semiconductor substrate 2. By using the insulating film 9 in the cell region 10 (the first region) as a mask, a gate oxide film 17 about 15 nm thick is formed on the HV region 20 and the logic region 30 by annealing as of dry HCl oxidation.

As a consequence, the 15-nm thick gate oxide film 17 directly grows in the logic region 30 (the third region) on the semiconductor substrate 2. However, the gate oxide film 14 is already formed in the HV region 20 (the second region) on the semiconductor substrate 2, so the gate oxide film 17 grows on the gate oxide film 14 in that region. Consequently, the gate oxide films 14 and 17 combine together into a gate oxide film 16 about 25 nm thick (FIGS. 14 and 15). Finally, a second polysilicon film 18 about 400 nm thick which serves as gate electrodes in the HV region and the logic region is deposited by CVD. This second polysilicon film 18 is activated by thermally diffusing an impurity such as phosphorus (FIG. 15).

The MOS transistors formed on the semiconductor substrate will be described below with reference to FIG. 16. As illustrated in FIGS. 9 and 16, in this embodiment, the semiconductor substrate is separated into the first region (cell region), the second region (HV region), and the third region (logic region), and these element formation regions are isolated by the field oxide film. The first and second polysilicon films 8 and 18 are appropriately patterned on the semiconductor substrate 2 to form gate electrodes of MOS transistors in these regions. The subsequent fabrication steps are then performed to form the MOS transistors. Consequently, an EPROM cell is formed in the cell region 10 as the first region, and a high-voltage MOS transistor is formed in the HV region 20 as the second region.

Also, a transistor whose gate oxide film thickness is small is formed in the logic region 30 as the third region. In the EPROM cell in the cell region 10, $n^+$-type source/drain regions 21 are formed in the surface region of the semiconductor substrate 2. A floating gate 8 made of the first polysilicon film is formed in a portion sandwiched between the regions 21 via the gate oxide film 19 about 25 nm thick. A control gate 18 made of the second polysilicon film is stacked on this floating gate 8 via the ONO insulating film 9. This cell is covered and protected by an insulating film and a protective film (neither is shown).

In the high-voltage MOS transistor in the HV region 20, $n^+$-type source/drain regions 22 are formed in the surface region of the semiconductor substrate 2. A gate electrode 18 made of the second polysilicon film is formed in a portion sandwiched between the regions 22 via the gate oxide film 16 about 25 nm thick. In the MOS transistor in the logic region 30, $n^+$-type source/drain regions 23 are formed in the surface region of the semiconductor substrate 2. A gate electrode 18 made of the second polysilicon film is formed in a portion sandwiched between the regions 23 via the gate oxide film 17 about 15 nm thick.

As described above, in this embodiment, the gate oxide film thickness in the first region (cell/HV region) of the semiconductor substrate 2 is different from the oxide film thickness in the second region. In the present invention, however, the thicknesses of the oxide films can be made equal regardless of regions where these films are formed, such that the gate oxide film thicknesses are equally 25 nm for all transistors. As an example, in the present invention, both of a MOS transistor in a cell/HV region and a MOS transistor in a logic region can be set to have a gate film thickness of about 25 nm.

In this embodiment, no dummy oxide film is necessary in the HV region 20 and the logic region 30. Therefore, the dilute HF treatment need only be performed the number of times smaller by one than that in conventional methods. As a result, the characteristics of the semiconductor device can be maintained well as shown in FIG. 17.

FIG. 17 is a graph showing the characteristics of the second embodiment and the prior art described earlier. In the present invention, a decrease in thickness of the field oxide film is reduced as described in this embodiment. Consequently, as illustrated in FIG. 17, a threshold voltage Vth of the high-voltage (Vpp=12.5 V) field transistor formed in the HV region 20 (the second region) can be well maintained at a predetermined value. FIG. 17 shows the dependence of the threshold voltage of the field transistor on the number of times the acid treatment is repeated. In FIG. 17, the ordinate indicates the threshold voltage Vth (V) of the field transistor in the HV region, and the abscissa indicates the number of times (time) of the dilute HF treatment which is an acid treatment required to remove the gate oxide film such as a dummy gate oxide film. In this embodiment, the number of times the acid treatment is repeated is three, and in the prior art, it is four. As in FIG. 17, an average value a of the threshold voltage Vth of the MOS transistor in the HV region is nearly 14 V, and the range of a variation in the threshold voltage exceeds a Vpp maximum guaranteed value (13.1 V). In the conventional semiconductor device, on the other hand, an average value b of the threshold voltage Vth of the MOS transistor in the HV region is at most about 12 V, and the range of a variation in the threshold voltage also is smaller than the maximum guaranteed value mentioned above.

A third embodiment will be described below with reference to FIGS. 18 to 23, and FIGS. 26 to 30 relating to the prior art. FIGS. 18 to 23 are sectional views of semiconductor structures of the fabrication steps of a semiconductor device having an EPROM cell region as a first region, an HV region as a second region which includes a control circuit for the EPROM, and a logic region as a third region. The former steps of the manufacturing method in this third embodiment are the same as those of the prior art manufacturing method and, thus will be described by referring to prior art FIGS. 26 to 30. A field oxide film 3 about 550nm thick for isolating these element formation regions is formed on the surface of a semiconductor substrate 2 which is made from, e.g., a p-type silicon semiconductor, by using a LOCOS process (FIG. 26). The formation of the field oxide film 3 isolates the cell region 10, the HV region 20, and the logic region 30 on the semiconductor substrate 2. A dummy oxide film 4 about 15 nm thick is then formed on the element formation regions on the surface of the semiconductor substrate 2 (FIG. 27). A photoresist 5 having a pattern which opens the cell region 10 and covers the HV region 20 and the logic region 30 is formed on the dummy oxide film 4. By using this photoresist 5 as a mask, boron ions (11B$^+$) are implanted into the cell region 10 under the conditions of 60 keV and 3×10$^{12}$ atoms/cm$^2$, performing channel ion implantation (channel implantation). Subsequently, the photoresist is removed by etching, and the dummy oxide film on the cell is etched away by a dilute HF treatment.

This dilute HF treatment is done by using a dilute HF solution containing NH$_4$F, HF, and H$_2$O. This treatment is the first acid treatment. By this treatment, the thickness of the field oxide film 3 is decreased (FIG. 28). Thereafter, a gate oxide film 7 about 25 nm in thickness is formed on the element formation regions on the semiconductor substrate 2 by annealing as of dry HCl oxidation (FIG. 29). After the formation of the gate oxide film 7, a 100-nm thick first polysilicon film 8 is formed on the element formation regions and the field oxide film by CVD (FIG. 30). An impurity such as phosphorus is diffused into this first polysilicon film 8. An insulating film 9 is formed on the first polysilicon film 8. The insulating film 9 is constituted by a three-layered film, i.e., an SiO$_2$/Si$_3$N$_4$/SiO$_2$ film (ONO film). The fabrication steps described prior to this point are identical with those in the prior art steps (FIGS. 26 to 30).

Figure 18:
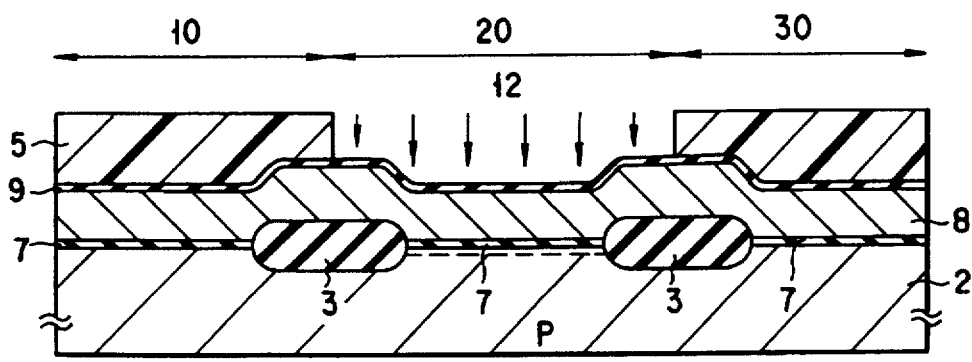

Following manufacturing steps differ from those in the method of the second embodiment, and will be described with reference to FIGS. 18 to 23. A photoresist 5 is formed on the insulating film 9 and so patterned as to cover the cell region 10 (the first region) and the logic region 30 (the third region) and to be removed from the HV region 20. By using this photoresist 5 as a mask and the first polysilicon film 8 as a buffer film, boron ions (11B$^+$) are implanted into a portion (the n-channel of HV) below the gate oxide film 7 through the first polysilicon film 8 in the HV region 20 and the insulating film 9 stacked on the film 8, under the conditions of 100 keV and 6×10$^{12}$ atoms/cm$^2$, thereby performing channel ion implantation 12 (FIG. 18).

Figure 19:
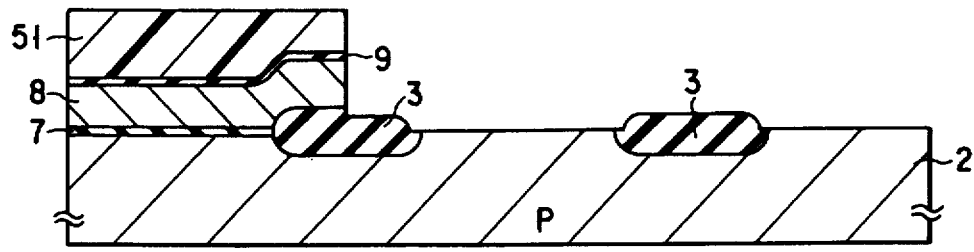

After the photoresist 5 is etched away, a photoresist 51 is formed on the insulating film 9 and patterned to cover only the cell region 10 (the first region). The insulating film 9 is selectively etched away by using this photoresist 51 as a mask, and portions of the first polysilicon film 8 in the HV region and the logic region 30 are removed by RIE. Thereafter, the exposed gate oxide film 7 is removed by the dilute HF treatment (FIG. 19). This treatment is the second acid treatment. Subsequently, the photoresist 51 on the cell region is etched away, and a gate oxide film 14 about 18 nm thick is formed on the HV region 20 and the logic region 30 (the third region) by annealing as of dry HCl oxidation. Consequently, an oxide film 13 is also formed on the side wall of the first polysilicon film 8 in the cell region 10 by the thermal oxidation. Thereafter, a photoresist 52 having a pattern which exposes the logic region 30 (the third region) is formed on the semiconductor substrate 2. By using this photoresist 52 as a mask, boron ions (11B$^+$) are first deeply implanted into a portion (the n-channel of 5 V) below the gate oxide film 14 in the logic region 30 under the conditions of 80 keV and 1.5×10$^{12}$ atoms/cm$^2$. Boron ions (11B$^+$) are then shallowly implanted into the same portion under the conditions of 40 kev and 2.5×10$^{12}$ atoms/cm$^2$. In this manner, channel ion implantation 15 is performed (FIG. 20).

Subsequently, by using the photoresist 52 as a mask, the gate oxide film 14 in the logic region 30 is removed by the dilute HF treatment (FIG. 21). This treatment is the third acid treatment. The photoresist 52 is then etched away from the semiconductor substrate 2. By using the insulating film 9 in the cell region 10 (the first region) as a mask, a gate oxide film 17 about 15 nm in thickness is formed on the HV region 20 and the logic region 30 by annealing as of dry HCl oxidation. As a consequence, the 15-nm thick gate oxide film 17 directly grows in the logic region 30 (the third region) on the semiconductor substrate 2. However, the gate oxide film 14 is already formed in the HV region 20 (the second region) on the semiconductor substrate 2, so the gate oxide film 17 grows on the gate oxide film 14 in that region. Consequently, the gate oxide films 14 and 17 combine together into a gate oxide film 16 about 25 nm thick (FIGS. 22 and 23).

Subsequently, a second polysilicon film 18 about 400 nm thick which serves as gate electrodes in the HV region and the logic region is formed by CVD. This second polysilicon film 18 is activated by thermally diffusing an impurity such as phosphorus (FIG. 22). The second polysilicon film 18 is processed into gate electrodes in the individual regions by the subsequent fabrication steps, and finally the same MOS transistors as in FIG. 16 are formed on the semiconductor substrate.

In this embodiment, a gate oxide film is used as the buffer film in the channel implantation performed in the logic region 30. This makes effective use of the oxide film feasible.

The accelerating voltage dependence of the projected range (the peak concentration position of ions), when the channel implantation buffer film is used in the fabrication steps of the semiconductor device of the present invention, will be described below with reference to FIGS. 24 and 25. In each of FIGS. 24 and 25, the ordinate indicates the peak concentration position (projected range) (nm) of ions, and the abscissa indicates the accelerating voltage (keV). B, P, and As were used as the ion species. FIG. 24 shows the results when a polysilicon film was used as the buffer film, and FIG. 25 shows the results when a silicon oxide film was used as the buffer film. Curves a to f in FIGS. 24 and 25 indicate the peak concentration positions (projected ranges) of ions when B (boron), P (phosphorus), and As (arsenic) were ion-implanted. Each position changes with the accelerating voltage. The curves a and d correspond to B, the curves b and e correspond to P, and the curves c and f correspond to As. Therefore, the thickness of the buffer film used in the present invention is restricted by the type of ion species and the accelerating voltage. The accelerating voltage of channel implantation is commonly about 120 keV or less. In order to use an ion species of any type, therefore, the thickness of the polysilicon film is preferably 100 nm or smaller, since heavy atoms such as As ions can no longer pass through the film if the film thickness is larger than about 100 nm.

In the above embodiments, boron is used and the invention is applied to n-channel transistors. However, it is of course possible to use P or As. In this case, the present invention is applied to p-channel transistors.

The above embodiments have been described using the semiconductor device mounting an EPROM. The present invention is not limited to this memory cell but similarly applicable to another element. Also, in each embodiment, the same polysilicon (the second polysilicon film) as the first conductive layer (the first polysilicon film) is used as the second conductive layer formed on a semiconductor substrate. However, the present invention is not restricted to these embodiments. For example, in a two-gate-structure memory cell of an EPROM, the first polysilicon film can be used as the first gate, and, as the second gate formed on the first polysilicon film, it is possible to use a layered film (polycide film) constituted by a polysilicon film and a molybdenum silicide film formed on the polysilicon film.

In the present invention as described above, in performing channel ion implantation for a transistor which uses the second polysilicon film as a gate electrode, the first polysilicon film is used as a buffer film prior to patterning for forming the gate electrode. Consequently, it is possible to omit the step of forming a dummy oxide film for the channel ion implantation and the step of peeling this dummy oxide film. It is also possible to prevent a decrease in thickness of the field oxide film caused by a dilute HF treatment used to peel the dummy oxide film. As a result, a decrease or variation in field inverting voltage can be prevented, and a leakage current between the fields can be prevented. Additionally, a variation in electrical characteristics of the field transistor or leakage resulting from a decrease in thickness of the field oxide film also can be expected to be prevented.

As has been described above, in the present invention, the polysilicon film to be used as the gate electrode is used as a buffer film in channel ion implantation for controlling the threshold voltage of the gate electrode of a transistor. This eliminates the need for a dummy gate oxide film that is conventionally used as a buffer film, and thereby makes it possible to omit an acid treatment such as a dilute HF treatment for removing the dummy gate oxide film. This consequently reduces a decrease in thickness of the field oxide film. Accordingly, it is possible to prevent degradation in the characteristics such as a decrease or variation in field inverting voltage of the transistor formed on a semiconductor substrate, and to prevent a reduction in the yield.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A method of fabricating a semiconductor device, comprising the steps of:

forming a field oxide film on a semiconductor substrate and providing element formation regions and an element isolation region on a major surface of said semiconductor substrate;

forming a first gate oxide film on an entire surface of said element formation regions on the major surface of said semiconductor substrate;

forming a first conductive layer on the entire major surface of said semiconductor substrate so as to cover said first gate oxide film;

performing, in a second region of said element formation regions on the major surface of said semiconductor substrate, channel ion implantation for controlling a threshold voltage of a MOS transistor to be formed in said second region, by using said first conductive layer as a buffer film;

removing said first conductive layer and said first gate oxide film from said element formation regions, excluding a first region and including said second region, on the major surface of said semiconductor substrate, thereby using said first conductive layer in said first region as a first gate electrode of a MOS transistor to be formed in said first region;

forming a second gate oxide film in said second region;

forming a second conductive layer on the entire major surface of said semiconductor substrate so as to cover said second gate oxide film; and using said second conductive layer in said second region as a second gate electrode of said MOS transistor to be formed in said second region.

2. A method according to claim 1, wherein a thickness of said first gate oxide film differs from a thickness of said second gate oxide film.

3. A method according to claim 1, further comprising the step of forming, in said first region, a memory cell with a layered gate structure which uses said first conductive layer as a floating gate and said second conductive layer, formed on said floating gate via an insulating interlayer, as a control gate.

4. A method according to claim 1, wherein said first conductive layer is made of a polysilicon film with a film thickness of not more than 100 nm.

5. A method according to claim 3, wherein said first conductive layer is made of a polysilicon film with a film thickness of not more than 100 nm.

6. A method of fabricating a semiconductor device, comprising the steps of:

forming a field oxide film on a semiconductor substrate and providing element formation regions and an element isolation region on a major surface of said semiconductor substrate;

forming a first gate oxide film on an entire surface of said element formation regions on the major surface of said semiconductor substrate;

forming a first conductive layer on the entire major surface of said semiconductor substrate so as to cover said first gate oxide film;

performing, in a second region of said element formation regions on the major surface of said semiconductor substrate, channel ion implantation for controlling a threshold voltage of a MOS transistor to be formed in said second region, by using said first conductive layer as a buffer film;

performing, in a third region of said element formation regions on the major surface of said semiconductor substrate, channel ion implantation for controlling a threshold voltage of a MOS transistor to be formed in said third region, by using said first conductive layer as a buffer film;

removing said first conductive layer and said first gate oxide film formed below said first conductive layer from said element formation regions, excluding a first region and including said second and third regions, on the major surface of said semiconductor substrate, thereby using said first conductive layer in said first region as a first gate electrode of a MOS transistor to be formed in said first region;

forming a second gate oxide film in said second region;

forming a third gate oxide film in said second and third regions such that said third gate oxide film overlaps said second gate oxide film in said second region;

forming a second conductive layer on the entire major surface of said semiconductor substrate so as to cover said third gate oxide film; and using said second conductive layer in said second and third regions as a second gate electrode and a third gate electrode of said MOS transistors to be formed in said second and third regions.

7. A method according to claim 5, further comprising the step of forming, in said first region, a memory cell with a layered gate structure which uses said first conductive layer as a floating gate and said second conductive layer, formed on said floating gate via an insulating interlayer, as a control gate.

8. A method according to claim 7, wherein said first conductive layer is made of a polysilicon film with a film thickness of not more than 100 nm.

9. A method according to claim 5, wherein said first conductive layer is made of a polysilicon film with a film thickness of not more than 100 nm.

10. A method of fabricating a semiconductor device, comprising the steps of:

forming a field oxide film on a semiconductor substrate and providing element formation regions and an element isolation region on a major surface of said semiconductor substrate;

forming a first gate oxide film on an entire surface of said element formation regions on the major surface of said semiconductor substrate;

forming a first conductive layer on the entire major surface of said semiconductor substrate so as to cover said first gate oxide film;

performing, in a second region of said element formation regions on the major surface of said semiconductor substrate, channel ion implantation for controlling a threshold voltage of a MOS transistor to be formed in said second region, by using said first conductive layer as a buffer film;

removing said first conductive layer and said first gate oxide film formed below said first conductive layer from said element formation regions, excluding a first region and including said second region and a third region, on the major surface of said semiconductor substrate, thereby using said first conductive layer in said first region as a first gate electrode of a MOS transistor to be formed in said first region;

forming a second gate oxide film in said second and third regions;

performing, in said third region of said element formation regions on the major surface of said semiconductor substrate, channel ion implantation for controlling a threshold voltage of a MOS transistor to be formed in said third region, by using said second gate oxide film as a buffer film;

removing said second gate oxide film from said third region;

forming a third gate oxide film in said second and third regions such that said third gate oxide film overlaps said second gate oxide film in said second region;

forming a second conductive layer on the entire major surface of said semiconductor substrate so as to cover said third gate oxide film; and using said second conductive layer in said second and third regions as a second gate electrode and a third gate electrode of said MOS transistors to be formed in said second and third regions.

11. A method according to claim 10, further comprising the step of forming, in said first region, a memory cell with a layered gate structure which uses said first conductive layer as a floating gate and said second conductive layer, formed on said floating gate via an insulating interlayer, as a control gate.

12. A method according to claim 11, wherein said first conductive layer is made of a polysilicon film with a film thickness of not more than 100 nm.

13. A method according to claim 10, wherein said first conductive layer is made of a polysilicon film with a film thickness of not more than 100 nm.

* * * * *